(12) United States Patent
Yamamoto

(10) Patent No.: US 7,428,255 B2
(45) Date of Patent: Sep. 23, 2008

(54) SEMICONDUCTOR LASER

(75) Inventor: Takeshi Yamamoto, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 398 days.

(21) Appl. No.: 10/956,035

(22) Filed: Oct. 4, 2004

(65) Prior Publication Data

US 2005/0074043 A1 Apr. 7, 2005

(30) Foreign Application Priority Data

Oct. 6, 2003 (JP) ............................. 2003-347332

(51) Int. Cl.
*H01S 3/04* (2006.01)
(52) U.S. Cl. ........................ 372/36; 372/34; 257/100; 257/678; 257/687; 257/701
(58) Field of Classification Search .................. 372/34, 372/36; 257/100, 678, 687, 701
See application file for complete search history.

(56) References Cited

U.S. PATENT DOCUMENTS

| | | | | |
|---|---|---|---|---|
| 5,309,460 | A | * | 5/1994 | Fujimaki et al. ............... 372/36 |
| 5,596,227 | A | * | 1/1997 | Saito ............................ 257/701 |
| 5,614,735 | A | * | 3/1997 | Kitamura et al. ............... 257/99 |
| 6,181,720 | B1 | * | 1/2001 | Kanemoto et al. ......... 372/43.01 |
| 6,828,170 | B2 | * | 12/2004 | Roberts et al. ................ 438/27 |
| 2003/0231672 | A1 | * | 12/2003 | Komoto ........................ 372/36 |

FOREIGN PATENT DOCUMENTS

| | | |
|---|---|---|
| CN | 1443385 A | 9/2003 |
| JP | 2-54263 | 4/1990 |
| JP | 10-154848 | 6/1998 |
| JP | 11-307871 | 5/1999 |
| JP | 2000-357839 | 12/2000 |
| JP | 2001-148456 | 5/2001 |
| JP | 2002-043672 | 2/2002 |

\* cited by examiner

*Primary Examiner*—Minsun Harvey
*Assistant Examiner*—Tod T Van Roy
(74) *Attorney, Agent, or Firm*—Rabin & Berdo, PC

(57) ABSTRACT

A semiconductor laser is constituted by a die pad and a plurality of leads formed by a plate-shaped lead frame that are integrally supported by a resin portion made of a mold resin, and a laser chip is mounted thereon through a sub-mount. The die pad and the tips of the leads are not subjected to forming processes, with the resin portion being formed on both of the surface and rear surface of one portion of the lead frame, while most of the rear surface of the die pad is exposed without being coated with the resin portion, and a fin for positioning and/or heat-radiating whose surface and rear-surface are exposed without being covered with the resin portion is formed on each of side portions of the die pad. With this structure, it becomes possible to provide a resin-mold-type semiconductor laser which accurately carries out a positioning process upon being attached to a housing or the like, and sufficiently carries out heat radiation, while improving adhesion between the lead frame and the resin.

11 Claims, 4 Drawing Sheets

FIG. 1A
FIG. 1B
FIG. 1C
FIG. 1D
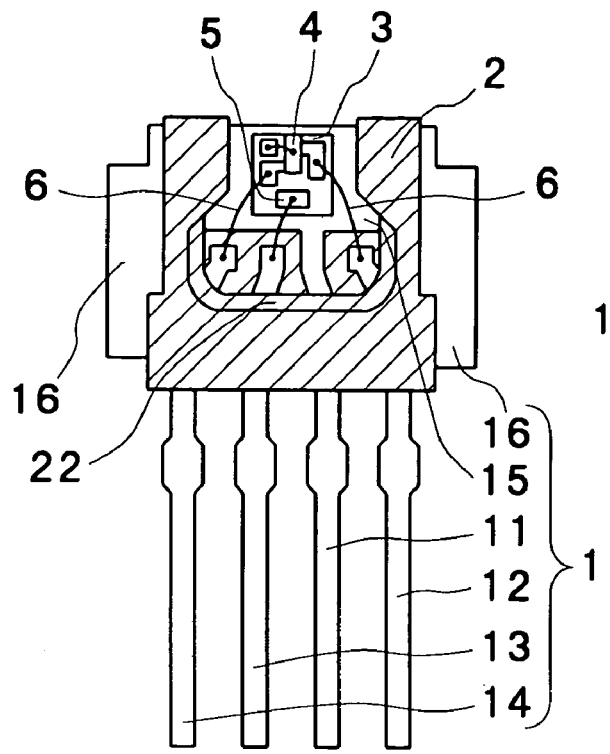
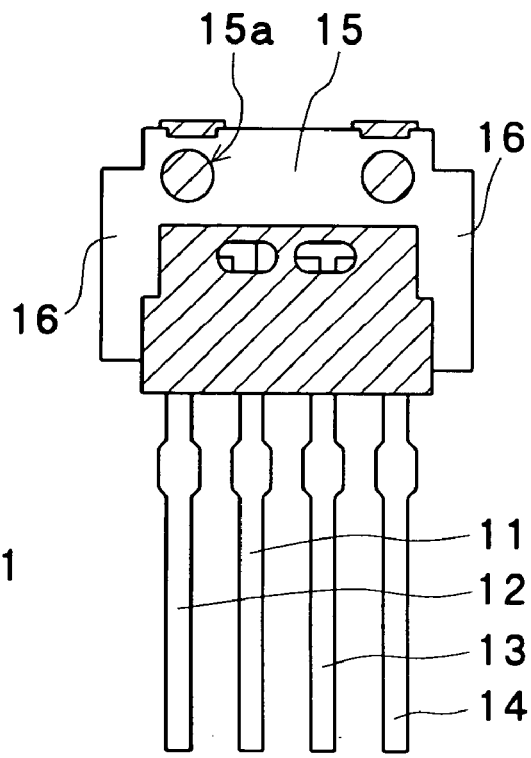
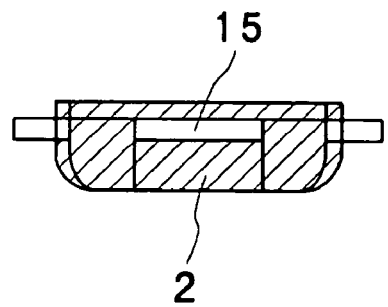
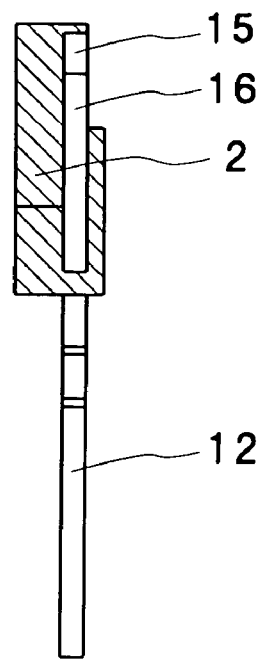

SEMICONDUCTOR LASER

FIELD OF THE INVENTION

The present invention relates to a mold-type semiconductor laser having a small size, which is easily manufactured at low costs, and is in particular suitably applied to a pickup-use light source for use in CDs, DVDs (digital versatile disks), DVD-ROMs and data-writable CD-R/RWs. More specifically, the present invention concerns a semiconductor laser that has an inexpensive structure constituted by a lead frame and a mold resin, although it is used for a high-power device and requires efficient heat dissipation.

BACKGROUND OF THE INVENTION

A mold-type semiconductor laser forming a package constituted by a lead frame and a mold resin has a structure, for example, shown in FIG. 8. As shown in FIG. 8, a sub-mount 67 to which a laser (LD) chip 68 is bonded is installed on a die pad 62a at the tip of a common lead 62 of three leads 62, 63 and 64 that are integrally formed as a lead frame 61. This LD chip 68 and a monitor-use light-receiving element 65 are wire-bonded to the other leads 63 and 64 through wires, not shown. Further, as shown in FIG. 8, a frame member 66, which has been, for example, transfer molded by using a synthetic resin, is formed on the peripheral portion except for the beam radiating side so that it is integrally formed together with the respective leads 62, 63 and 64; thus, the respective leads 62 to 64 are secured even when they are separated from the lead frame 61.

In the case when the entire lower face of the lead frame is exposed, from the necessity of preventing short-circuiting between the adjacent leads 62 to 64 due to heat radiation from the die pad 62a upon being formed on an electric conductor or the like, and of firmly securing the leads 62 to 64 onto the frame member 66, resin is directed round to the rear-face side of the lead frame 61 so as to cover the leads 62 to 64 on the periphery thereof. In this case, however, since the die pad 62a is more easily allowed to dissipate heat when it is exposed, a down-set forming process in which the portion of the die pad 62a is lowered from the face of the lead frame 61 to be exposed is carried out, or an up-set forming process in which, without deforming the lead 62 of the die pad 62a, the tips of the leads 63 and 64 on both of the sides are bent upward is carried out, as shown in FIG. 8.

As described above, the conventional mold-type semiconductor laser has a structure in which the die pad rear face of the lead frame is exposed to form a flat face so that it is made in contact with a heat radiation plate and the like so as to dissipate heat. However, in the case when the down-set forming process or the up-set forming process in which the die pad is pressed downward from the frame surface or the tips of the other leads are pushed up is carried out, complex processes are required, and these processes tend to cause a return after the processes and a deformation due to contact with other members, making it difficult to control forming precision. Further, even a slight deviation in the forming shape tends to cause resin burrs upon molding, resulting in a failure in firmly making the die pad rear face in contact with the heat radiation plate to cause the subsequent insufficient heat radiation.

Moreover, the lead portion is often coated with resin, and since the die pad portion has a structure in which, as shown in FIG. 8, the resin is placed only on one face on the periphery thereof, the adhesive strength is weak with the result that the die pad tends to be raised from the resin portion to cause degradation in the wire-bonding reliability when the raised die pad is moved.

Furthermore, when assembled in a pickup, the semiconductor laser is placed in a housing or the like to be accurately positioned and also to allow heat dissipation, and in this case, since the resin portion is formed on the periphery of the die pad as the frame member, the positioning process has to be carried out on the resin portion; however, the resin portion fails to provide an accurate positioning process due to the occurrence of resin burrs and the like, and consequently to cause a failure in determining an accurate position as well as a failure in dissipating heat with the exposed portion of the die pad being firmly made in contact with the housing. In this case, even when the resin portion is made in contact with the housing, it is not possible to sufficiently radiate heat due to a poor thermal conductivity in the resin. In particular, along with the recent developments in data-writable CD-R/RWs and the like, there have been demands for higher-power semiconductor lasers, and those having a higher power ranging from a conventional level of 5 mW to not less than 200 mW are required, and the resulting problem is that the service life of the semiconductor laser would be shortened without efficient heat dissipation.

Moreover, along with the current developments in lighter, thinner and small-size electronic apparatuses, there have been demands for smaller-size pickups as well as demands for smaller-size semiconductor lasers, and it is, therefore, not possible to make the external shape larger so as to improve heat dissipation.

SUMMARY OF THE INVENTION

The present invention has been devised to solve the above-mentioned problems, and its objective is to provide a mold-type semiconductor laser that allows an accurate positioning process when installed in a housing or the like, and also provides sufficient heat dissipation, while improving the adhesion between a lead frame and resin.

Another objective of the present invention is to provide a semiconductor laser that has a devised structure so as not to make a pickup larger even when the semiconductor laser is installed diagonally in the pickup or the like.

In accordance with the present invention, a semiconductor laser includes a die pad and plurality of leads formed by a plate-shaped lead frame, a resin portion made of a mold resin that integrally supports the die pad and the leads and a laser chip that is mounted on a surface side of the die pad, and in this structure, the die pad and tips of the leads of the lead frame are not subjected to a forming process in a direction perpendicular to a face of the lead frame, with the resin portion being provided on both of the surface and rear surface of one portion of the lead frame so as to integrally hold the leads and the die pad, while one portion of the die pad rear surface is exposed without being coated with the resin portion, and a fin for positioning and/or heat-radiating whose surface and rear-surface are exposed without being covered with the resin portion is formed on a side portion of the die pad.

A recessed section is formed in the top portion rear-surface of the die pad, and the resin portion, formed on the surface of the die pad, is embedded inside the recessed section in the rear-surface of the die pad through the top portion of the die pad, with the resin embedded in the recessed section and the die pad rear-surface on the top side being made to substantially the same plane with each other; thus, the resin and the die pad are well-engaged with each other, and the die pad rear-surface on the top side, that is, the most of the area from the top portion of the die pad rear-surface is allowed to form a flat face so that this is properly made in contact with an external heat-radiating plate such as a housing so as to dissipate heat.

Moreover, it is preferable that a corner portion of the resin portion is chamfered from a surface side to a side face of the resin portion in a shape of a plane face or a rounded face. By this structure, even when the semiconductor laser is placed inside a pickup with a predetermined tilt angle, it is possible to preferably install the semiconductor laser without the necessity of increasing the size of the pickup so much. Here, a shape of a plane face or a rounded face refers to straight-line-shape or arc-shape in corner portion in the cross-sectional shape.

Specifically, on the rear-surface of the above-mentioned lead frame, the fin and the resin portion are formed so that an area of the resin portion is made smaller than an area of the lead frame to be exposed without being coated with the resin portion; thus, the area of the metal portion (lead frame) to be made in contact with the external heat-radiating plate, such as a housing, is made greater to improve the heat-radiating effect.

More specifically, the fin and the resin portion are formed so that, when a distance between a center axis corresponding to the light proceeding direction of the laser chip and an outermost side edge of the fin is A, a distance between the center axis and an outermost side edge of the resin portion is B, a distance between a lower edge of the resin portion and an upper edge of the resin portion is C, and a distance between the lower edge of the resin portion and an upper edge of the die pad is D, a sum (A−B+D−C) exceeds 2 mm, and a width of the largest portion of the fin is smaller than 5.6 mm; thus, the exposure area of the metal portion is made larger, with the external dimension being maintained the same as the conventional semiconductor laser, making it possible to effectively radiate heat.

In accordance with the present invention, first, since the lead frame is not subjected to the forming process in a direction perpendicular to the frame face, it is possible to eliminate processes required for the forming process, and also to maintain the die pad and the like at stable positions, and in the case of molding with resin, it is possible to eliminate deviations to the metal mold, and consequently to prevent occurrence of resin burrs and the like to form a predetermined shape.

Secondly, since the resin portion is formed in a manner so as to also coat the rear-surface side of one portion of the lead frame, the resulting structure is less susceptible to peeling and the like, making it possible to ensure high reliability in the adhesion.

Thirdly, since the fin, the surface and rear-surface of which are exposed without being coated with the resin portion, is formed on a side portion of the die pad, the fin can be used as a reference for positioning upon setting the semiconductor laser in, for example, a housing; therefore, since it is possible to carry out the setting process with very high precision, and also to make the fin and the die pad rear-surface in closely contact with the housing (heat-radiating plate), the heat-radiating property can be greatly improved.

Moreover, the recessed section is formed on the top portion rear-surface on the die-pad rear-surface, and the resin portion is directed round to the recessed section, or an anchor-use through hole is formed in the die pad with the resin being injected therein so that the die-pad rear-surface on the top side is made substantially flush; thus, since the most portion of the die pad is exposed so as to be easily made in contact with the heat-radiating plate such as a housing without any resin protruding portions being present on the top side, it is possible to carry out the contacting process to the housing, while the housing being positioned by using the fin.

As a result, in accordance with the present invention, even in the case of a high-power-use semiconductor laser, it is possible to provide a very inexpensive mold-type structure by using a lead frame and a mold resin, with a fin, placed on a die-pad side portion, being utilized for the positioning process to the housing and for the heat-radiating process; therefore, it becomes possible to assemble the semiconductor laser with high precision, and also to manufacture it at very low costs, with a superior heat-radiating property. Consequently, the present invention greatly contributes to improvement in reliability of electronic apparatuses using pickups, such as CDs, DVDs, DVD-ROMs and data-writable CD-R/RWs, and a cost reduction thereof.

BRIEF DESCRIPTION OF THE DRAWINGS

FIGS. 1A to 1D are front, back, plan and side views that explain a structure of one embodiment of a semiconductor laser in accordance with the present invention;

DETAILED DESCRIPTION

Figure 2:
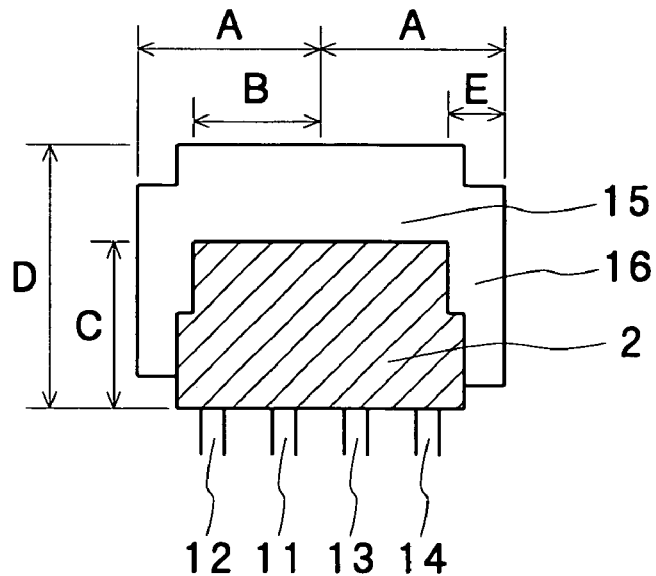
FIG. 2 is a drawing that explains a dimensional relationship between a resin portion and a lead frame that is exposed without being coated with the resin of the semiconductor laser of FIG. 1.

Next, referring to drawings, the following description will discuss a semiconductor laser in accordance with the present invention. As shown in FIGS. 1A to 1D that explain the front, rear, top and side faces of a semiconductor laser in accordance with one embodiment of the present invention, a die pad 15, formed by a plate-shaped lead frame 1 (see FIG. 3), and a plurality of leads 11 to 14 are integrally held by a resin portion 2 made of a mold resin (the resin portion 2 is indicated by a hatched portion in FIG. 1). A laser chip 4 is mounted on the die pad 15 through a sub-mount 3.

Here, with respect to the die pad 15 of the lead frame 1 and the tips of the leads 11 to 14, in order to integrally hold the leads 11 to 14 and die pad 15 without the necessity of being subjected to forming processes in a direction perpendicular to the lead frame, as shown in FIGS. 1A to 1D, the resin portion 2 is provided on both of the surface and rear-surface of one portion of the lead frame, with one portion of the rear-surface of the die pad 15 being exposed without being coated with the resin portion 2, and a fin 16 for positioning and/or heat-radiating, the surface and rear-surface of which are exposed without being coated with the resin portion 2 is formed on each of the side portions of the die pad 15. FIG. 1 shows an example which have four leads that are used for a two-wavelength semiconductor laser; however, even in the case of three leads that are used for a normal one-wavelength semiconductor laser, the same structure is used.

Figure 3:
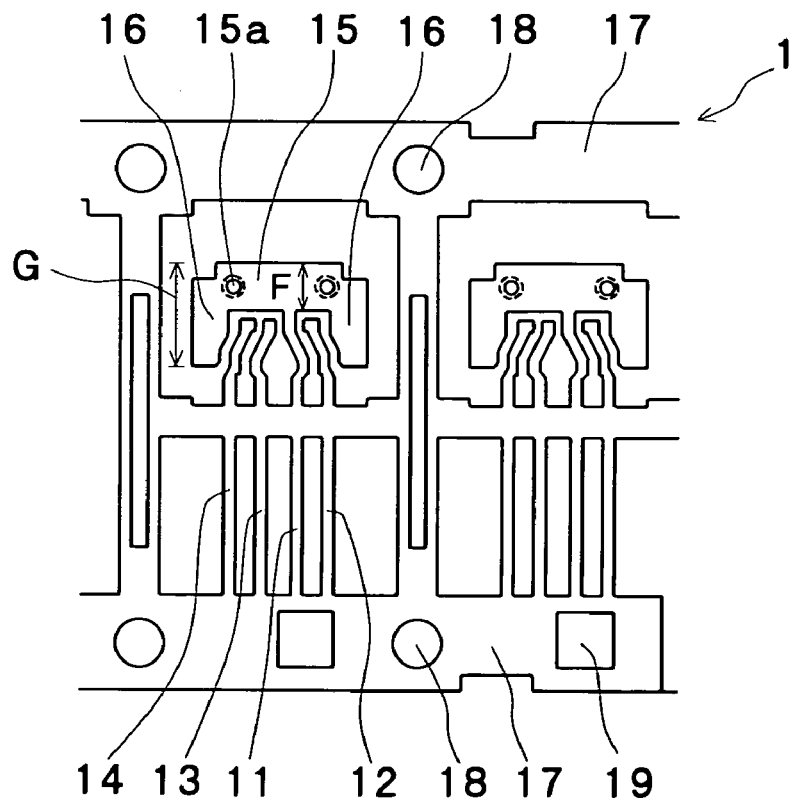
FIG. 3 is an explanatory drawing that shows the lead frame to be used for the semiconductor laser of FIG. 1.

The lead frame 1 is formed through processes in which: a plate member having a thickness of about 0.2 to 0.4 mm, made of, for example, 42 alloy, copper or copper alloy, is subjected to a stamping process and the like as shown in FIG. 3, and first to fourth leads 11 to 14 are secured to a side rail 17, with a die pad 15 being formed on the tip of the first lead 11, and the fin 16 for positioning and/or heat-radiating is formed on each of the side portions of the die pad 15. Wire bonding portions are respectively formed on the tips of the second to fourth leads 12 to 14, and a number of these sets are connected to each other. As shown in FIGS. 1A to 1D, after the resin portion 2 has been formed on the lead frame 1, the laser chip 4, etc. are assembled thereon, and the respective leads 11 to 14 are cut off from the side rail 17 so that respective semiconductor lasers are separated. Here, reference numeral 18 represents an index hole, and reference numeral 19 represents a frame-transport feeding hole. FIGS. 1A-1C show that the fin 16 includes a fin front surface and a fin rear surface that are both exposed without being covered with the resin portion 2, and FIG. 1D shows that a rear surface of the die pad 15 on a top side is substantially planar from an end on one side to an end on the other side (FIGS. 1C and 1D, which show the rear surface from two perpendicular directions, illustrate that it is planar by showing it as a straight line in both views.) FIG. 1D shows that the semiconductor laser has a step difference between the top side and the bottom side. FIG. 1D also shows that the rear surface of the die pad 15 on the top side is bare of resin, that is, that the area of the die pad 15 rear surface that is exposed without being coated with the resin portion 2 coincides with the rear surface of the die pad 15 on the top side. FIGS. 1B and 1D show that the rear surface of the semiconductor laser on a top side is substantially planar from an end on one side to an end on the other side. FIG. 1C shows that the fins 16 project to the sides beyond any portion of the resin portion 2.

The present invention features that the fin 16 is further formed on each of the side portions of the die pad 15 of the lead frame 1 in a manner so as to extend continuously from the die pad 15. The fin 16 is formed so as to be exposed from the resin portion 2 without being coated with the resin portion 2; thus, upon attaching the semiconductor laser to a housing or the like, the fin 16 is inserted into a positioning groove of the housing so that the attaching process is carried out in an accurately positioned state. For this purpose, at least, when A to E are represented as shown in FIG. 2, the sum of widths E=A−B (see FIG. 2) and D−C of portions that are not coated with the resin portion 2 is set to not less than 2 mm, and the entire width 2A (see FIG. 2) is set to not more than 5.6 mm, that is, a diameter of the stem of the conventional can-type structure. In other words, by setting the value of A−B+D−C to not less than 2 mm, the contact area between the housing and the groove is maintained in a level so as to accurately hold the position of the semiconductor laser, with sufficient heat dissipation. Specific examples are: 2A=about 5.2 mm; height of the die pad 15, F (see FIG. 3)=about 1.4 mm; length of the fin 16, G (see FIG. 3)=about 3.4 mm; A−B=about 0.75 mm; and D−C=about 1.45 mm.

Figure 4:
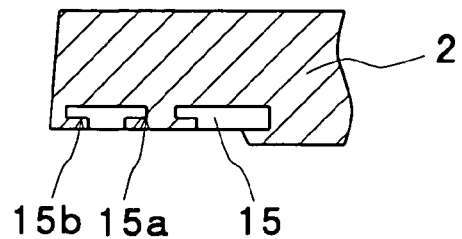
FIG. 4 is a cross-sectional explanatory drawing that shows a recessed section on the top portion of a die pad and an anchor-use through hole portion of the semiconductor laser of FIG. 1.

Moreover, in an example shown in FIG. 3, two anchor-use through holes 15a are formed in the die pad portion 15. As shown in a partial cross-sectional view of FIG. 4 that explains the state after formation of the resin portion 2, the through hole 15a has a greater diameter on the rear-surface side of the die pad 15, while it forms a small hole with a step on the surface side; thus, this structure makes the resin less susceptible to separation after it has been embedded. Furthermore, although not shown in FIG. 3, concave sections 15b (coining-type squash portion), as shown in FIG. 4, are formed at two positions (portions at which the resin portion 2 is directed round to the rear-surface side from the top portion of the die pad 15 in FIG. 1B) so that the resin portion 2 on the surface side directed through the top portion, and buried into the concave sections 15b on the rear-surface side of the die pad 15, thereby also forming a structure that is less susceptible to separation. With this structure, the resin portion 2 is firmly secured to the die pad 15, with the rear surface of the die pad 15 being formed into a flat face so as to be easily made in contact with a housing or the like.

The resin portion 2 is used for firmly securing the first to fourth leads 11 to 14 so as not to be divided into individual pieces even when they are separated from the lead frame, with the respective electrodes of a laser chip 4 or the like and the leads 11 to 14 being positively connected, and is formed by using a resin molding process such as a transfer molding process in the state of the above-mentioned lead frame 1. Normally, in the case when the rear surface of the die pad 15 is exposed, after having formed a die pad portion or the like, the resin is subjected to a molding process, as described earlier; however, the present invention provides a structure in which, without the forming process of the lead frame, most of the rear surface of the die pad 15 is exposed, while the molding process is being carried out in a flat state, as it is.

For this reason, in the present invention, as shown in FIGS. 1A and 1B, the resin portion 2 is formed so as to cover the side portions of the die pad 15 and the base portions of the leads 11 to 14 on the surface side, and also formed so that it is directed round to the rear-surface side of the lead frame through the top portion and the bottom side so as to reach the lower edge of the die pad 15. On the top portion, the resin portion 2 is directed round in a manner as shown in FIG. 4 so that it is allowed to reach only the inside of the recessed section 15b formed in the rear-surface of the die pad 15; thus, the resin surface is substantially flush with the rear-surface of the die pad 15, and formed into a flat face. Here, on the surface side of the resin portion 2, a taper portion 22 is formed on a portion corresponding to the rear portion of the leaser chip 4 so that light, emitted from the rear-end face of the laser chip 4, is not reflected to return toward the laser chip 4 side.

In contrast, on the bottom side, the resin portion 2 is directed round so as to cover the lead portions 11 to 14 and the lower edge of the die pad 15 so that a step difference is formed between the rear surface of the die pad 15 and the rear-side surface of the resin portion 2. In other words, normally, in the case when the die pad rear-surface is exposed in the device of this type, in general, a lead forming process is carried out so as to allow the entire die pad rear-surface to form a flat face, or no resin portion is formed on the rear-surface side; however, in the present invention, in order to maintain the flatness of the lead frame, as it is, the resin portion 2 is also placed on the rear-surface side, without carrying out the forming process on the lead frame, so that a step difference is intentionally formed so as to provide a structure that can firmly secure the leads 11 to 14 and the portion of the die pad 15 by using the resin portion 2 with a small area; thus, without the necessity of enlarging the entire size, it is possible to expose the fin 16 from the resin portion 2 so as to be used for positioning and/or heat-radiating purposes.

Figure 5:
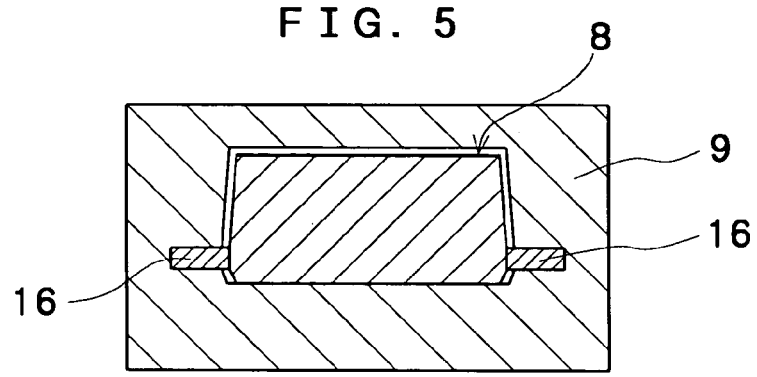
FIG. 5 is an explanatory drawing that shows a contacting state between the semiconductor laser shown in FIG. 1 that has been inserted to a housing so as to be attached to a pickup and the housing.

Although the rear-surface side is not formed into a complete flat face since the rear surface of the die pad 15 and the surface of the rear-surface-side resin portion 2 are not coincident with each other, actually, it is essential for a semiconductor laser of this type to have proper positioning and heat-radiating process, in particular, in the case when a high-power-use semiconductor laser is incorporated into a pickup; therefore, as shown in FIG. 5, the semiconductor laser 8 is inserted into a housing 9 made of metal having good heat conductivity, such as aluminum or zinc, and the positioning process of the semiconductor laser is carried out, while the housing together with the semiconductor laser is being shifted. For this reason, in the present invention, since the top side of the semiconductor laser 8 is formed into a flat face with the step difference being formed inside the housing 9, by inserting it from the top side into the housing, it is possible to carry out the attaching process with the die pad rear surface being made closely contact with the inside of the housing 9, without receiving the influences from the protruding portions of the resin portion 2. FIG. 5 shows in an exaggerated manner that it is inserted with the fin 16 and the rear surface of the die pad 15 being made in closely contact with the housing 9 and that the resin portion has a gap to the housing 9, which is formed by taking dimensional deviations due to molding into consideration.

The fin 16, which is exposed from the resin portion 2, is preferably made as large as possible so that the portion to be engaged with the housing 9 becomes greater from the viewpoints of the positioning stability and heat radiation. Here, since the total size is not made greater, the area of the resin portion 2 has to be made smaller, as described above, in order to widen the width of the fin 16 that is not coated with the resin portion 2. After extensive research efforts made by the inventor of the present invention, it has been found that, as described earlier, with respect to the center axis corresponding to the light proceeding direction of the laser chip in the dimensional display given by FIG. 2, the exposed portion of the lead frame is preferably set so that the sum (A−B+D−C) of the difference between distance A (see FIG. 2) to the outermost side edge of the fin 16 and distance B from the center axis to the outermost side edge of the resin portion 2 and the difference between distance D from the lower edge of the resin portion 2 to the upper edge of the die pad 15 and distance C from the lower edge of the resin portion 2 to the upper edge of the resin portion 2 exceeds 2 mm. Here, the width 2A of the largest portion of the fin 16 is made smaller than 5.6 mm, which corresponds to the diameter of the conventional canned structure.

In the case when the above-mentioned dimensions are indicated by other expressions, the fin 16 and the resin portion 2 are preferably formed so that in the rear surface of the lead frame shown in FIG. 2, the area of the resin portion 2 is made smaller than the area of the read frame to be exposed without being coated with the resin portion 2. In other words, the present invention makes the contact areas of the fin 16 and the die pad 15 to the housing as large as possible so that the positioning of the semiconductor laser 8 is carried out accurately with respect to the housing 9 with heat being dissipated as easily as possible. For this reason, as described earlier, while the flat-face property is properly maintained without subjecting the lead frame to forming processes, the resin portion is intentionally directed round to the rear-surface side to form a step difference so that the exposed area of the fin 16 is made larger, with the area of the resin portion being made smaller.

Figure 6A:
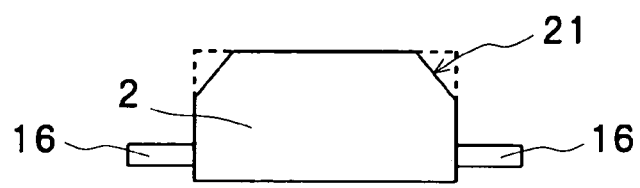
FIGS. 6A and 6B are an explanatory drawing that shows a state in which a C-chamfered face (plane face) is formed in one of corners of the resin portion of the semiconductor layer in accordance with the present invention and an explanatory drawing that shows the fact that the housing can be made thinner when the semiconductor laser is attached with a tilt angle of θ with respect to the housing.
Figure 6B:
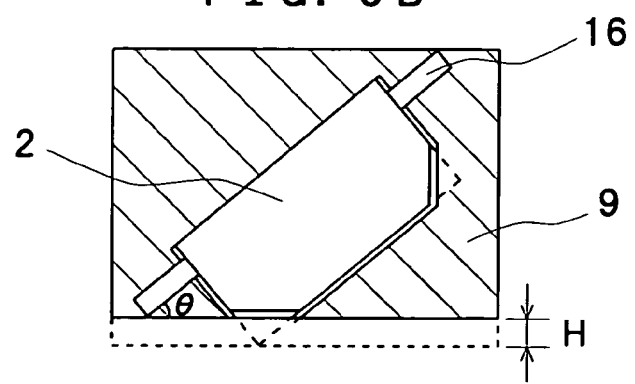

In an example shown in FIG. 1C, the shape from the surface side of the resin portion 2 to each of the side faces is formed to have an R-chamfered face. This structure is made because, in some cases, the laser beam needs to be emitted with a predetermined tilt angle upon attaching the semiconductor laser to a pickup, and in such cases, as shown in FIG. 6, the semiconductor laser needs to be attached to the inside of the housing 9 in a tilted manner. Here, in the case when the corner portion of the resin portion 2 is formed into a square corner, as indicated by a broken line in FIG. 6B, the housing 9 becomes larger; in contrast, when the corner portion 21 is formed into an R-chamfered or C-chamfered face (for example, FIG. 6 shows a C-chamfered face), the dimension of the housing is shortened by H, thereby making it possible to provide a thinner pickup. This R-chamfered face or C-chamfered face is formed with a width of about 0.5 mm in the above-mentioned dimensional example.

The laser chip 4 is formed so as to have a normal double-hetero structure made from, for example, an AlGaAs-based or InGaAlP-based compound semiconductor, and has a size of about 250 µm×250 µm in the case of a CD-use model, a size of about 250 µm×500 µm in the case of a DVD-use model, and a size of about 250 µm×800 µm in the case of a CD-R/RW-use model. These sizes are very small, and in order to further provide easiness in handling and ensure a heat-radiating property, further to release the stress based on a difference in the thermal coefficient between the laser chip and the lead frame, the laser chip is normally bonded to a sub-mount 3 that has a size of about 0.8 mm×1 mm, and is made of a silicon substrate in which PIN photo diode may be incorporated, an AlN (alumina nitride) substrate, or the like. FIG. 1 shows an example of a two-wavelength-use laser chip in which: two-wavelength-use electrode terminals are drawn, and as shown in FIG. 1A, one of the electrodes, which is connected to the sub-mount 3 through wire-bonding using a gold line 6 or the like, is connected to the first lead 11 from the rear surface thereof through the die pad 15 by using a conductive adhesive or the like, with the other electrode (rear-surface electrode) being connected to the second and fourth leads 12 and 14 via a connecting portion on the sub-mount 3 through wire bonding by using a gold wire 6 or the like.

Moreover, a light-receiving element 5, which is used for monitoring the light-emitting power of the laser chip 4, is placed on the sub-mount 3 in the same manner, and one of the electrodes is connected to the first lead 11 through the sub-mount 3 and the die pad 15 or the like, with the other electrode being directly electrically connected to the third lead 13 through wire bonding by using a gold wire 6 or the like. Here, the light-receiving element 5 may be placed at a position different from the sub-mount 3, or the light-receiving element 5 may be omitted, if it is not necessary.

In accordance with the present invention, the positioning-use and heat-radiating-use fin is placed on each of the side portions of the die pad without being coated with the resin portion, with a sufficient width (not less than 0.5 mm); therefore, upon attaching the semiconductor laser to a housing, the attaching process is positively carried out with high precision with respect to the housing, and the fin and most of the portion of the die pad rear-surface are made in contact with the housing with good adhesion, thereby making it possible to greatly improve the heat-radiating property. In other words, with respect to the lead frame, the upper and lower surfaces of the frame are not subjected to forming processes so that each of the rear surfaces of the fin and the die pad is maintained as the lead frame having a flat face, and since the thickness of the fin that is not coated with the resin is determined by the lead frame, and is not susceptible to influences from resin burrs, the fitting process to the housing is positively carried out. Consequently, as shown in FIG. 5, the die pad rear-surface, which forms the same face as the rear-surface of the fin is made in contact with the housing without having any gap, thereby making it possible to radiate heat efficiently from a wider area.

Here, with respect to the relationship between the lead frame and the resin portion, since the lead frame is coated with the resin portion from both of the surface and rear-surface on the lower edge side of the die pad, the two members are joined to each other with superior adhesion. Moreover, a concave section (coining-type squash portion) is also formed on the die pad upper edge of the die pad rear-surface to provide a resin-directing section; thus, it becomes possible to further improve the adhesion without impairing the flat-face property of the die pad rear-surface. Furthermore, by forming a through hole with an anchor-use step difference in the die pad, it becomes possible to improve the adhesion more effectively.

Furthermore, by chamfering corners of the resin portion, the thickness of the housing (heat-radiating plate) is made thinner even when the semiconductor laser is installed in a manner so as to tilt by an angle θ, and the thickness of the pickup is consequently made thinner, making it possible to provide a thinner electronic apparatus.

As a result, the present invention makes it possible to carry out a positioning process accurately even in the case of a high-power semiconductor laser of, for example, not less than 200 mW, by using a mold-type package using a lead frame and a mold resin, and consequently to provide a high-performance pickup with a superior heat-radiating property at low costs.

Figure 7:
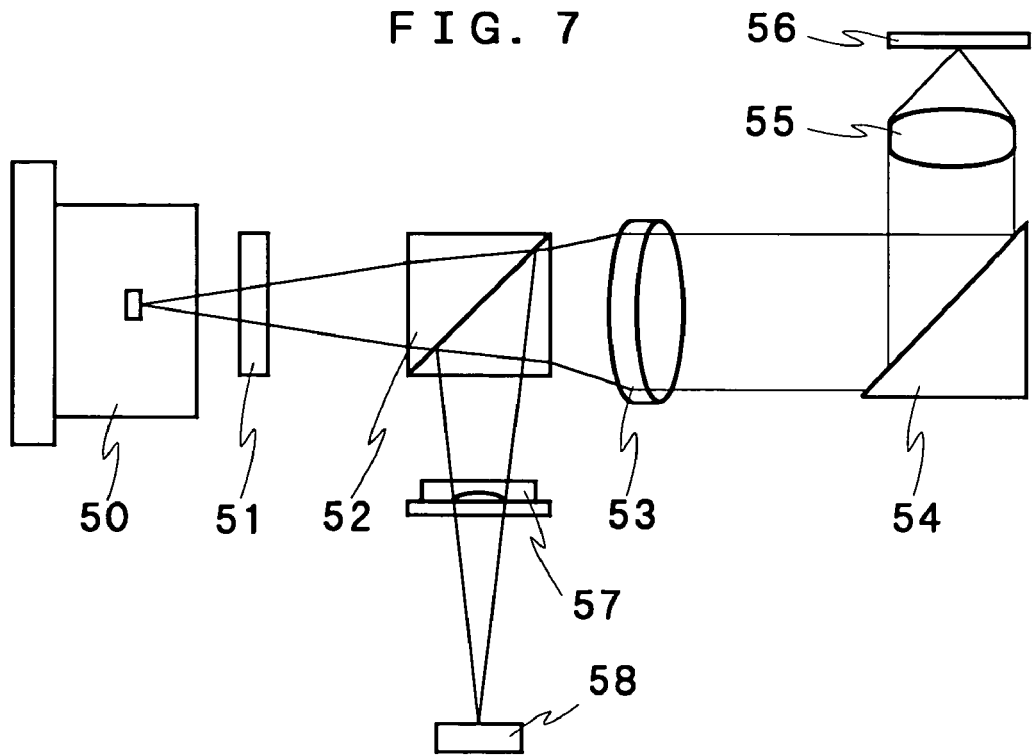
FIG. 7 is an explanatory drawing that shows a structural example of the pickup.
Figure 8:
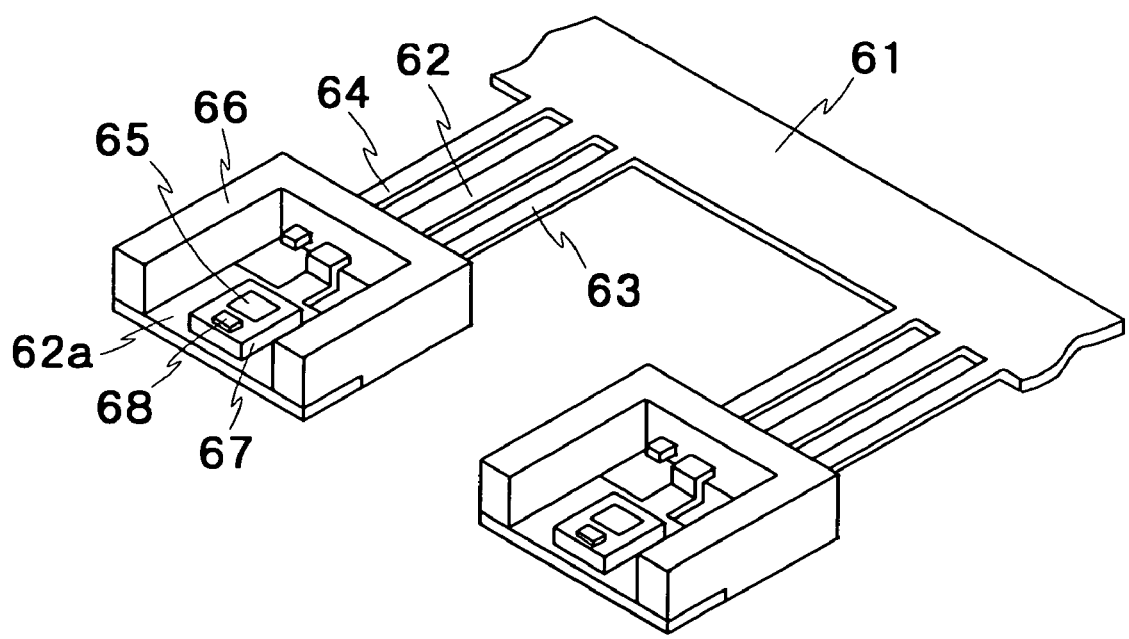
FIG. 8 is an explanatory drawing that shows a conventional semiconductor laser made of resin mold.

FIG. 7 is an explanatory drawing that schematically shows a system in which a thin pickup is formed by using this semiconductor laser. In other words, a semiconductor laser 50 is placed laterally, and light, directed from the semiconductor laser, is divided into three portions by using a diffraction grating 51 through, for example, a three-beam method, and the resulting rays are formed into parallel light beams by using a collimator lens 53 through a beam splitter 52 that separates outgoing light and reflected light; thus, the resulting beams are bent by a prism mirror (reflecting mirror) 54 by 90° (z-axis direction), and then focused on the surface of a disk 56 such as a DVD and a CD by an objective lens 55. Further, light reflected from the disk 56 is directed through a beam splitter 52, a concave lens 57, etc., to a photo-detector 58 so as to be detected. Here, in FIG. 7, the semiconductor laser 50 and the photo-detector 58 are located substantially on the same face (xy face). Here, the semiconductor laser 50, which has been inserted in the above-mentioned heat-radiating-use and positioning-use housing (heat-radiating plate), is actually set.

Although preferred examples have been described in some detail it is to be understood that certain changes can be made by those skilled in the art without departing from the spirit and scope of the invention as defined by the appended claims.

What is claimed is:

1. A semiconductor laser comprising:
a die pad and a plurality of leads formed by a plate-shaped lead frame, the die pad having a bottom portion adjacent the leads of the lead frame and a top portion opposite to the leads;
a resin portion made of a mold resin that integrally supports the die pad and the leads; and
a laser chip that is mounted on a front surface of the top portion of the die pad,
wherein the die pad and tips of the leads of the lead frame are not subjected to a forming process in a direction perpendicular to a front-side surface of the lead frame,
the resin portion is provided on both of the front surface and an opposite rear surface of the bottom portion of the die pad and the tips of the leads so as to integrally hold the leads and the die pad, while the rear surface of the top portion of the die pad is exposed without being coated with the resin portion,
a side portion of the die pad comprises a fin for positioning and/or heat-radiation, the fin including a fin front surface and a fin rear surface that are both exposed without being covered with the resin portion, and
wherein a recessed section is formed in the top portion of the rear surface of the die pad, and the resin portion, formed on the front surface of the die pad, is embedded inside the recessed section formed on the rear surface of the die pad through a top end of the die pad, with the resin embedded in the recessed section and the rear surface of the top portion of the die pad being made to substantially the same plane with each other.

2. The semiconductor laser according to claim 1, wherein a rear-side face of the lead frame is entirely flattened from a portion which is provided with the laser chip on the front surface to the top end of the die pad.

3. The semiconductor laser according to claim 1, wherein a corner portion of the resin portion is chamfered from a surface side to a side face of the resin portion in a shape of a plane face or a rounded face.

4. The semiconductor laser according to claim 1, wherein on the rear-surface of the lead frame, the fin and the resin portion are formed so that an area of the resin portion is made smaller than an area of the lead frame to be exposed without being coated with the resin portion.

5. The semiconductor laser according to claim 1, wherein a taper portion is formed on the resin portion corresponding to a rear portion of the leaser chip so that light, emitted from a rear-end face of the laser chip, is not reflected to return toward the laser chip side.

6. The semiconductor laser according to claim 1, wherein the resin portion is formed so that the fin, which is exposed without being coated with the resin portion, has a width of not less than 0.5 mm.

7. The semiconductor laser according to claim 6, wherein the fin is inserted into a housing so as to be made in contact with the housing made of metal having good heat conductivity.

8. The semiconductor laser according to claim 1, wherein the laser chip is a two-wavelength-use laser chip.

9. The semiconductor laser according to claim 1, wherein the fins project to the sides beyond any portion of the resin portion.

10. A semiconductor laser, comprising:
a die pad and a plurality of leads formed by a plate-shaped lead frame, the die pad having a bottom portion adjacent the leads of the lead frame and a top portion opposite to the leads;
a resin portion made of a mold resin that integrally supports the die pad and the leads; and
a laser chip that is mounted on a front surface of the top portion of the die pad,
wherein the die pad and tips of the leads of the lead frame are not subjected to a forming process in a direction perpendicular to a front-side surface of the lead frame, the resin portion is provided on both of the front surface and an opposite rear surface of the bottom portion of the die pad and the tips of the leads so as to integrally hold the leads and the die pad, while the rear surface of the top portion of the die pad is exposed without being coated with the resin portion, a side portion of the die pad comprises a fin for positioning and/or heat-radiation, the fin including a fin front surface and a fin rear surface that are both exposed without being covered with the resin portion, and wherein the fin and the resin portion are formed so that, when a distance between a center axis corresponding to the light proceeding direction of the laser chip and an outermost side edge of the fin is A, a distance between the center axis and an outermost side edge of the resin portion is B, a distance between a lower edge of the resin portion and an upper edge of the resin portion is C, and a distance between the lower edge of the resin portion and an upper edge of the die pad is D, a sum (A −B +D−C) exceeds 2 mm, and a width of the largest portion of the fin is smaller than 5.6 mm.

11. A semiconductor laser comprising:

a die pad and a plurality of leads formed by a plate-shaped lead frame, the die pad having a bottom portion adjacent the leads of the lead frame and a top portion opposite to the leads;

a resin portion made of a mold resin that integrally supports the die pad and the leads; and a laser chip that is mounted on a front surface of the top portion of the die pad, wherein the die pad and tips of the leads of the lead frame are not subjected to a forming process in a direction perpendicular to a front-side surface of the lead frame, the resin portion is provided on both of the front surface and an opposite rear surface of the bottom portion of the die pad and the tips of the leads so as to integrally hold the leads and the die pad, while the rear surface of the top portion of the die pad is exposed without being coated with the resin portion, a side portion of the die pad comprises a fin for positioning and/or heat-radiation, the fin including a fin front surface and a fin rear surface that are both exposed without being covered with the resin portion, and wherein a through hole with a step, which has a greater diameter on the rear surface of the die pad and a smaller diameter on the front surface of the die pad, is formed in the die pad.

* * * * *